United States Patent [19]

Mintchev et al.

[11] Patent Number: 4,792,730
[45] Date of Patent: Dec. 20, 1988

[54] CIRCUIT FOR INTERRUPTING ARC DISCHARGE IN A GAS-DISCHARGE VESSEL

[75] Inventors: Mintcho S. Mintchev, Sofia; Svetoslav A. Savov, Komplex Mladost; Emil I. Krestev, Sofia, all of Bulgaria

[73] Assignee: V M E I "Lenin", Sofia, Bulgaria

[21] Appl. No.: 814,683

[22] Filed: Dec. 30, 1985

[30] Foreign Application Priority Data

Dec. 29, 1984 [BG] Bulgaria ................................ 68215

[51] Int. Cl.$^4$ ............................................ H05B 41/36
[52] U.S. Cl. ................................ 315/209 SC; 315/306; 315/308
[58] Field of Search ......... 315/209 SC, 209 R, 209 T, 315/307, DIG. 5, 306, DIG. 7, 206, 107

[56] References Cited

U.S. PATENT DOCUMENTS 4,329,627  5/1982  Holmes ........................ 315/209 SC Primary Examiner—David K. Moore
Assistant Examiner—T. Salindong
Attorney, Agent, or Firm—Herbert Dubno

[57] ABSTRACT

The device consists of a series network of a rectifier and a choke connected in parallel with a gas-discharge vessel and a capacitor. Between an intermediate tap of the primary of the saturating transformer and the positive terminal of the recitifer a thyristor is connected so that its cathode is connected with the intermediate tap. The control circuit of the thyristor consist of connected with each other secondary of the saturating transformer, unit for control pulse shaping, whose input is connected with the output of a voltage sensor mounted across the gas-discharge vessel. Between the intermediate tap of the primary of the saturating transformer and the positive terminal of the rectifier a series circuit of a diode and a second choke is connected so that the anode of the diode is connected with the intermediate tap.

1 Claim, 1 Drawing Sheet

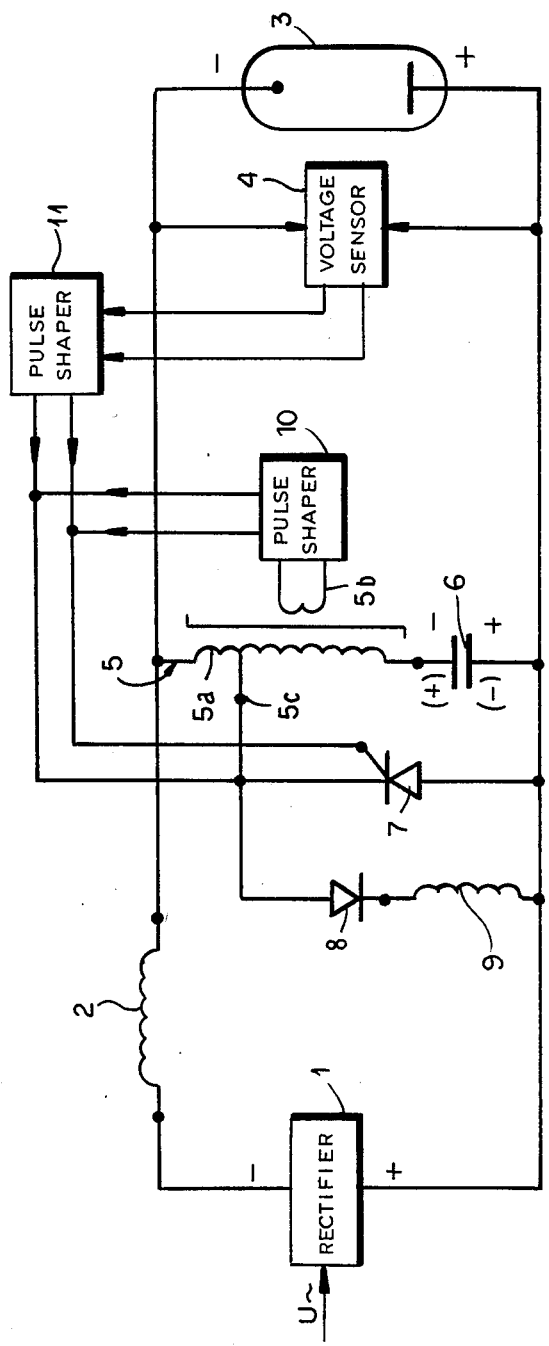

CIRCUIT FOR INTERRUPTING ARC DISCHARGE IN A GAS-DISCHARGE VESSEL

FIELD OF THE INVENTION

The present invention relates to a device for interrupting arc discharge in a gas-discharge vessel used for workpiece surface treatment in the machine industry.

BACKGROUND OF THE INVENTION

Circuitry for interrupting arc discharge in a gas-discharge vessel is known. This circuitry consists of a rectifier which is connected in parallel through a choke with the gas-discharge vessel and a series circuit including the rimary winding of a saturating transformer and a capacitor. Between an intermediate tap of the primary winding of saturating the transformer and the positive terminal of the rectifier a thyristor is mounted, its cathode being connected with the intermediate tap. The input of a unit for control pulse shaping is connected with the secondary of the saturating transformer whose two outputs are connected correspondingly with both outputs of an autonomous unit for control pulse shaping and correspondingly with the gate and the cathode of the thyristor BG22690.

A disadvantage of this device is its inefficiency which is due to the fact that the period from the time of turning off the thyristor until the time of glow discharge excitation varies depending on the value of discharge current. Large periods of this type corresond to small values of discharge current, and vice versa.

OBJECT OF THE INVENTION

An object of this invention is to provide a circuit for interrupting arc discharge in a gas-discharge vessel used in a technological process, which demonstrates the same efficiency when used with both small and nearly nominal values of the current through the gas-discharge vessel.

SUMMARY OF THE INVENTION

This object can be achieved with a circuit for interrupting arc discharges which comprises a rectifier connected in parallel through a first choke to the gas-discharge vessel, a voltage sensor and a series circuit consisting of the primary of a saturating transformer and a capacitor. Between an intermediate tap of the primary winding of a saturating transformer and the positive terminal of the rectifier, a thyristor and a series circuit of a diode and a second choke are connected in parallel. The thyristor cathode and the diode anode are connected to the intermediate tap. The input of an unit for control pulse shaping is connected with the secondary winding of the saturating transformer. The two inputs of the voltage sensor are connected with the two inputs of an autonomous unit for control pulse shaping whose two outputs are connected correspondingly with the gate and the cathode of the thyristor and with the two outputs of the unit for control pulse shaping.

The advantages of the device for interrupting arc discharges in a gas-discharges vessel used in a technological process according to the present invention are the increased efficiency of utilization because the period from the time of turning off the thyristor untill the time of glow discharge excitation is constant of the value of discharge current, and the protection obtained against the application of overvoltages to the gas-discharge vessel.

BRIEF DESCRIPTION OF THE DRAWING

One possible embodiment of the device for interrupting arc dischage in a gas-discharge vessel in a technological process according to the present invention is shown by the sole FIGURE of the accompanying drawing which is a schematic diagram of the device.

SPECIFIC DESCRIPTION

As shown in the drawing, the circuit for interrupting arc discharge in a gas-discharge vessel 3 consists of a rectifier 1 which is connected in parallel through a first choke 2 with the gas-discharge vessel 3, a voltage sensor 4 and a series circuit including the primary winding 5a of saturating transformer 5 and a capacitor 6. Between an intermediate tap 5c of the primary winding of the saturating transformer 5 and the positive terminal of the rectifier 1, a thyristor 7 and a series circuit of diode 8 and a second choke 9 are connected in parallel; the cathode of thyristor 7 and the anode of diode 8 are connected with the intermediate tap 5c. The input of a unit 10 00; for control pulse shaping 10 is connected with the secondary of the saturating transformer 5. The two outputs of the voltage sensor 4 are connected to the two inputs of an autonomous unit 11 for control pulse shaping, whose two outputs are connected correspondingly with the gate and the cathode of thyristor 7 and with the two outputs of the unit for control pulse shaping 10.

The operation of the device for interrupting arc discharges in a gas-discharge vessel used in the technological process according to the present invention is as follows: in consequence of the action of rectifier 1 an electric glow discharge is excited in a gas-discharge vessel 3, and the capacitor 6 starts charging so that the magnetic core of saturating transformer 5 is saturated for the charging period of capacitor 6 to the negative value of the saturation induction. When the electric glow discharge in the gas-discharge vessel 3 spontaneously begins to change into an arc discharge the voltage between the cathode and the anode of gas-discharge vessel 3 begins to drop, and on the primary of the saturating transformer 5 a voltage is obtained which is equal to the difference between the voltage on capacitor 6 and the voltage between anode and cathode of gas-discharge vessel 3. The voltage induced in the secondary of saturating transformer 5 is shaped by the unit for control pulse shaping 10 and the thyristor 7 is turned on. When the thyristor 7 is in turned-on state the current through it is limited by the first choke 2. The voltage on the capacitor 6 is applied through the turned-on thyristor 7 to the corresponding part of the primary of saturating transformer 5. Then an inverse voltage defined by the proportion between the parts of the primary winding 5a of saturating transformer 5 is applied between the anode and the cathode of gas-discharge vessel 3. This inverse voltage causes a change in the direction of electric field in gas-discharge vessel 3 for a given period thereby helping the deionization process is the anode-cathode space of gas-discharge vessel 3. Through the thyristor 7 the discharge current of capacitor 6 passes passing together with the current from the rectifier 1 which also passes through this part of the primary of saturating transformer 5, which is situated at the cathode side of gas-discharge vessel 3, and the choke 2, the magnetic core of the saturating transformer 5 being re-magnetized from the negative value of the saturation induction to its positive value. When the part of the primary which is connected with the capacitor 6 has an industivity at the saturation state of magnetic core, this part of the primary and the capacitor 6 form a resonance circuit whereby the capacitor 6 re-charges to a voltage whose polarity is reversed in comparison with the initial one and is shown in brackets in the drawing. Under the effect of this voltage the magnetic core of saturating transformer 5 becomes re-magnetized from the positive value of saturation induction to its negative value. This part of the primary winding which is connected to the capacitor 6 and has an inductivity at the saturation state of magnetic core forms again with the capacitor 6 a resonance circuit, where the capacitor 6 begins to get recharged. The re-charging current of capacitor 6 passes through the thyristor 7 in its reverse direction and when the value of this current reaches and exceeds the value of the current through the thyristor 7, the thyristor is turned off. Further, the re-charging process is carried out with a constant duration that is indpendent of the value of the current through the gas-discharge vessel 3 and is determined only by the parameters of the resonance circuit including the capacitor 6, the part of the primary of saturating transformer 5 which is connected with the capacitor 6 and has an inductivity at saturation state of the magnetic core, the diode 8, and the second choke 9. After the end of the repeated re-charging process the voltage on capacitor 6 continues to rise with a polarity, which is the same as the initial one, under the effect of the current passing from rectifier 1 through the capacitor 6, the primary of saturating transformer 5, and first choke 2. The process of increasing the voltage is interrupted until the excitation of glow discharge in the gas-discharge vessel 3. When the preset value of the voltage between the anode and the cathode of the gas-discharge vessel 3 measured by sensor 4 is exceeded, the autonomous unit for control pulse shaping 11 turns on the thyristor 7, and then such processes are carried out in the device which are the same as those when the glow discharge changes spontaneously into an arc discharge; in such way the gas-discharge vessel is protected against voltages greater than its rated voltage. If there is another spontaneous transition from glow discharge into an arc discharge and the preset value of the voltage between the anode and the cathode of gas-discharge vessel 3 is exceeded again, the described action of the device is repeated.

What we claim is:

1. A circuit for quenching a transition from a glow discharge to an arc discharge in a gas-discharge vessel for surface treatment of industrial materials with the glow discharge from said gas-discharge vessel, comprising:

a gas discharge vessel having an anode and a cathode;

a series network of a rectifier and a first choke continuously connected directly in parallel across said anode and said cathode of said gas-discharge vessel for applying a glow-discharge-sustaining direct current thereto;

a saturating transformer having a tapped primary winding connected in a series connection with a capacitor, said series connection being connected directly across said series network and said anode and cathode of said gas-discharge vessel, said saturating transformer further having a secondary winding;

a thyristor having a gate, an anode connected with a positive terminal of said rectifier and a cathode connected with a tap of said primary winding located closer to a terminal of the primary winding connected to said cathode of said vessel than to a terminal of the primary winding connected to the anode of said vessel;

a series network of a diode and a second choke connected across said anode and cathode of said thyristor with an anode of said diode being connected to said tap whereby the series network of the diode and the second choke is connected in parallel to said thyristor for rapid restoration of a voltage across the anode and cathode of said vessel upon termination of the discharge; .

a control pulse shaper having an input connected to said secondary winding and an output connected to a gate and the cathode of said thyristor for rendering said thyristor conductive upon a drop in voltage sensed by said transformer as a voltage difference between a voltage across said capacitor and a voltage across said anode and cathode of said gas-discharge vessel and representing a transition from a normal glow discharge to an arcing condition in said vessel, thereby impressing upon said vessel a voltage inversion to quench said arc discharge;

a voltage sensor connected across said anode and cathode of said gas-discharge vessel and responsive to a development of an excess voltage thereacross; and another control pulse shaper having an input connected to said voltage sensor and an output connected to the gate and cathode of said thyristor for triggering said thyristor into conduction upon a detection of said excess voltage by said voltage sensor.

* * * * *